(12) United States Patent
Lai et al.

(10) Patent No.: US 6,387,750 B1
(45) Date of Patent: May 14, 2002

(54) METHOD OF FORMING MIM CAPACITOR

(75) Inventors: Erh-Kun Lai, Taichung; Shou-Wei Hwang, Chilung; Jiann-Jen Chiou, Tainan; Yu-Ping Huang, Taichung, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/895,389

(22) Filed: Jul. 2, 2001

(51) Int. Cl.7 .......................................... H01L 21/8242
(52) U.S. Cl. ...................................... 438/250; 438/239
(58) Field of Search ................................ 438/239, 240, 438/243, 250, 386, 393, 396

(56) References Cited

U.S. PATENT DOCUMENTS 5,918,135 A * 6/1999 Lee et al. .................... 438/250
6,259,128 B1 * 7/2001 Adler et al. ................. 257/296

* cited by examiner

Primary Examiner—David Nelms
Assistant Examiner—David Vu

(57) ABSTRACT

A method of forming a metal-insulator-metal (MIM) capacitor is disclosed. The method provides a three dimensional MIM capacitor having upgraded capacitance. A plurality of trenches are formed within the MIM capacitor to increase the charge storage area of the MIM capacitor without occupying additional planar area thereby upgrade the capacitance of the MIM capacitor and the integration.

16 Claims, 4 Drawing Sheets

METHOD OF FORMING MIM CAPACITOR

BACKGROUND OF THE INVENTION

1. Field of the Invention

The present invention relates to a method of forming a metal-insulator-metal capacitor, and more particularly to a method of forming a metal-insulator-metal capacitor having a three dimensional structure.

2. Description of the Related Art

Capacitor structures for semiconductor integrated circuits include metal-oxide-semiconductor (MOS) capacitors, PN junction capacitors, and polysilicon-insulator-polysilicon (PIP) capacitors. Each of these capacitor structures includes at least one monocrystalline silicon layer or polycrystalline silicon layer which is used as a capacitor electrode. The use of silicon for the capacitor electrode, however, may result in a higher electrode resistance than is desired.

It is thus desirable to reduce the resistance of capacitor electrodes to decrease frequency dependence of the capacitor. Accordingly, metal-insulator-metal (MIM) thin film capacitors have been developed to provide low electrode resistances. Moreover, metal-insulator-metal capacitors can be used in integrated circuits requiring high speed performance. In addition, metal-insulator-metal thin film capacitors have been applied to advanced analog semiconductor devices because these capacitors have capacitance fluctuation rates dependent on voltage and temperature which are sufficiently low to provide desirable electrical characteristics.

In addition, there have been efforts to reduce thicknesses of dielectric layers for integrated circuit capacitors to thereby increase the performance of capacitors including these thinner dielectric layers. In particular, the capacitance of a capacitor can be increased by reducing the thickness of the dielectric layer between the two electrodes of the capacitor. There have also been efforts to increase capacitances by using dielectric layers having relatively high dielectric constants, and by increasing the surface areas of the capacitor electrodes. Furthermore, multi-wiring or multilevel interconnect processes have been applied to semiconductor manufacturing methods to facilitate the development of high-density integration and microelectronic technology. Accordingly, metal-insulator-metal thin film capacitors can be manufactured together with multi-wiring structures. FIG. 1 shows a cross-sectional diagram of a conventional metal-insulator-metal capacitor. The metal-insulator-metal capacitor comprising a lower aluminum electrode 102, an insulating layer 106 and an upper aluminum electrode 108 is formed on a substrate 100. A dielectric layer 110 and a titanium nitride layer 104 are also shown in this figure. In view of the demands of high integration and large capacitance, the conventional planar MIM capacitor shown in FIG. 1 will not meet the requirement of modern integrated circuits gradually. Thus it is very necessary to provide a novel process of forming MIM capacitors which can provide a new structure of the MIM capacitors having large capacitance as well as high integration of the integrated circuit. It is toward these goals that this invention specially directs.

SUMMARY OF THE INVENTION

It is therefore an object of the invention to provide a process of forming a three dimensional MIM capacitor.

It is another object of this invention to provide a MIM capacitor having a three dimensional structure and an upgraded capacitance.

It is a further object of this invention to provide a three dimensional MIM capacitor which can effectively upgrade the integration of integrated circuits.

To achieve these objects, and in accordance with the purpose of the invention, the invention uses a method comprising: providing a substrate having a first region and a second region; forming a first conductive layer over said substrate and a second conductive layer over said first conductive layer; transferring a plurality of trench patterns into said second conductive layer and said first conductive layer to form a plurality of trenches in said first region and said second region; conformally forming a dielectric layer over said second conductive layer and said first conductive layer; forming a third conductive layer over said dielectric layer; forming a photoresist layer to cover said first region; removing said third conductive layer on said second region to expose said dielectric layer on said second region; removing said dielectric layer on said second region to expose said second conductive layer and said first conductive layer on said second region; etching through the bottoms of said trenches in said second region to expose said substrate; and removing said photoresist layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
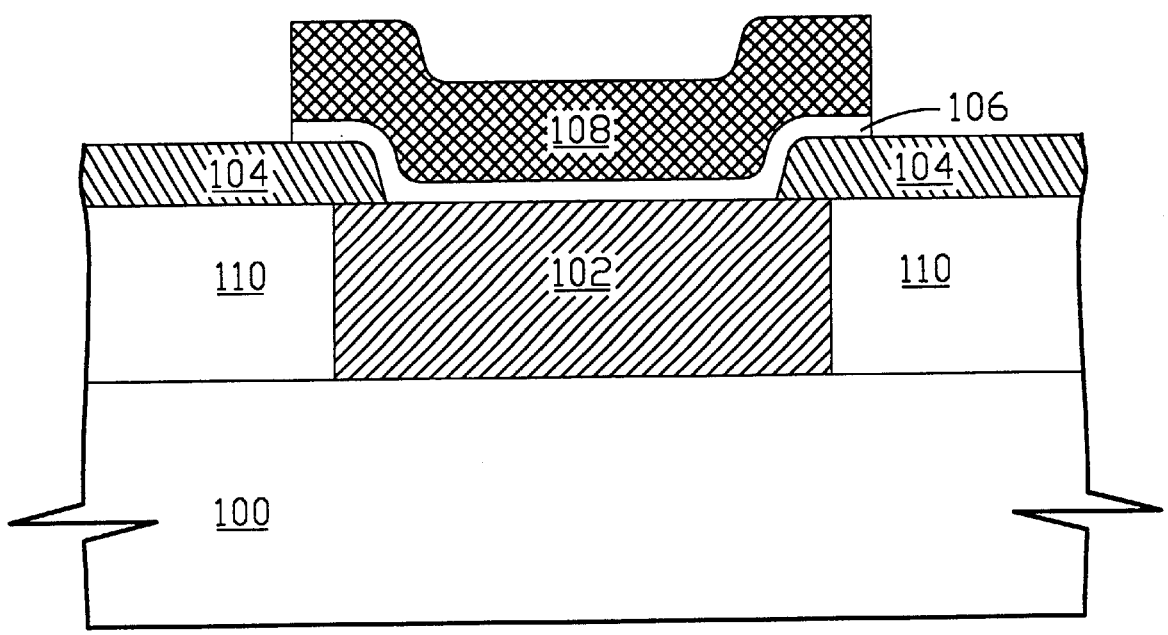
FIG. 1 shows a cross-sectional diagram of a conventional metal-insulator-metal capacitor.
Figure 2A:
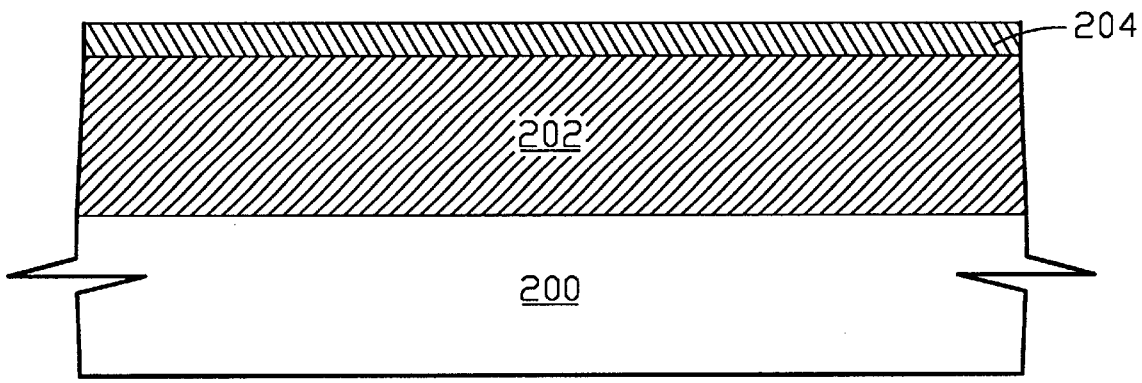
FIG. 2A shows a substrate having two conductive layers sequentially formed thereon.

Referring to FIG. 2A, conductive layers 202 and 204 are sequentially formed over a substrate 200. The substrate 200 comprises, but is not limited to: a silicon dioxide substrate. The substrate 200 can also comprise other insulating substrate such as a borophosphosilicate (BPSG) substrate as well as low-k dielectric substrate such as a fluorosilicate glass (FSG) substrate, a hydrogen silsesquioxane (HSQ) substrate, a methyl silsesquioxane (MSQ) substrate and a benzocyclobutene (BCB) substrate. Furthermore, the substrate 200 usually comprises a multilevel interconnect structure which is not shown for simplicity. The conductive layer 202 preferably comprises, but is not limited to: an aluminum layer as well as an aluminum alloy layer. Other conductive layer such as a copper layer and a copper alloy layer should not be excluded. The conductive layer 202 can be formed by using conventional methods such as physical vapor deposition. The conductive layer 202 has a thickness of from about 7000 angstrom to about 10000 angstrom, and the conductive layer 202 preferably has a thickness of about 9000 angstrom. The conductive layer 204 comprises, but is not limited to: a titanium nitride layer. A titanium/titanium nitride (Ti/TiN) layer and a tantalum/tantalum nitride (Ta/TaN) layer can also be used. The conductive layer 204 can be formed by using conventional physical vapor deposition (PVD) or chemical vapor deposition (CVD) processes. The conductive layer 204 has a thickness of from about 1000 angstrom to about 3000 angstrom, and the conductive layer 204 preferably has a thickness of about 2000 angstrom.

Figure 2B:
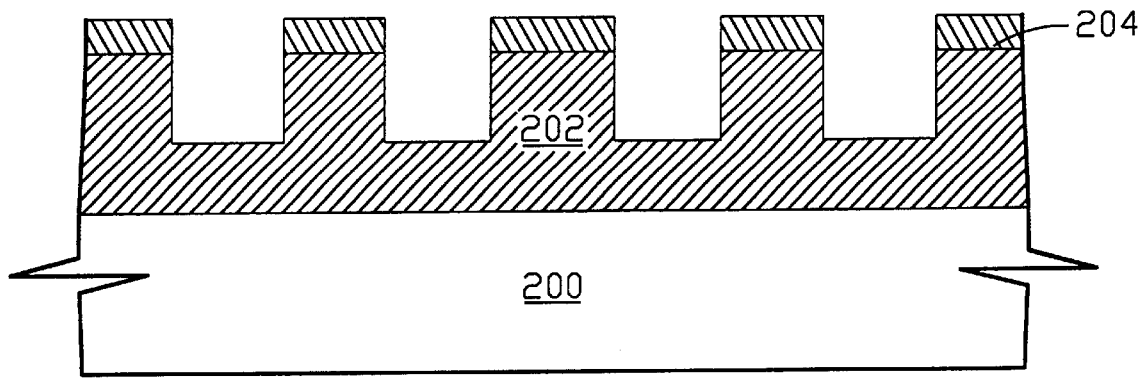
FIG. 2B shows a result of etching the structure shown in FIG. 2A to form trenches therein.

Referring to FIG. 2B, the conductive layers 202 and 204 are etched to form trenches by using conventional etching processes such as dry etching. The etching process is preferably, but is not limited to: a reactive ion etching process. These trenches have a depth of from about 6000 angstrom to about 11000 angstrom. It is noted that the depths set forth are exemplary only, the depth actually depends on the total thickness of the conductive layers 202 and 204. The conductive layer 202 should not be etched through to expose the substrate 200. The thickness between the bottom of these trenches and the interface of the conductive layer 202 and the substrate 200 is preferably about 2000 angstrom.

Figure 2C:
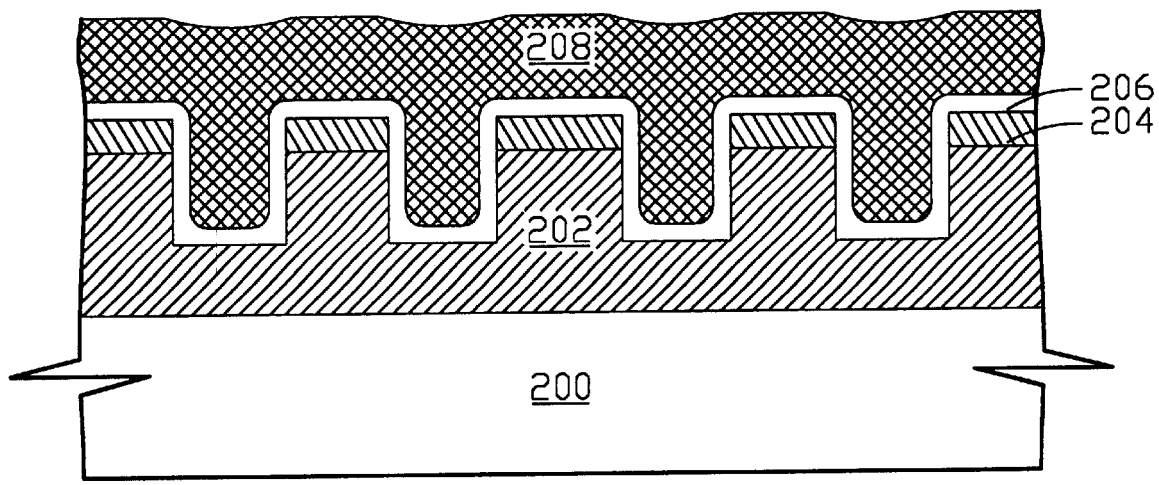
FIG. 2C shows a result of conformally forming a dielectric layer and a conductive layer over the structure shown in FIG. 2B thereon.

Referring to FIG. 2C, a dielectric layer 206 and a conductive layer 208 are sequentially formed over the structure shown in FIG. 2B. The dielectric layer 206 comprises, but is not limited to: a silicon dioxide layer or a silicon nitride layer formed by conventional chemical vapor deposition such as plasma enhanced chemical vapor deposition. The dielectric layer 206 has a thickness of from about 100 angstrom to about 1000 angstrom. The conductive layer 208 comprises, but is not limited to: an aluminum layer or an aluminum alloy layer. A copper layer or a copper alloy layer can also be used. The conductive layer 208 can be formed by conventional methods such as physical vapor deposition. The conductive layer 208 has a thickness of from about 500 angstrom to about 10000 angstrom. The conductive layer 208 preferably has a thickness of about 2000 angstrom.

Figure 2D:
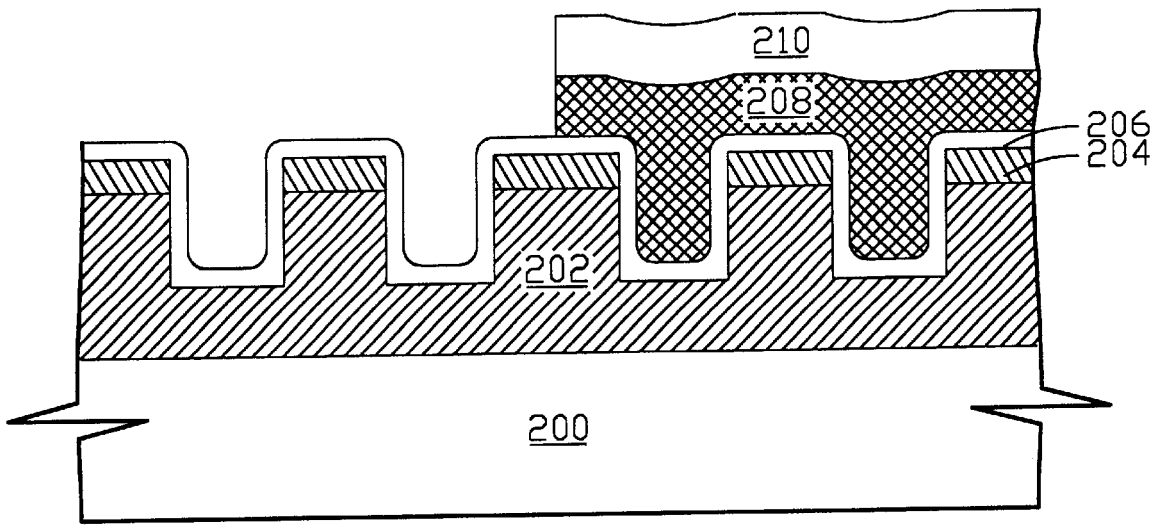
FIG. 2D shows a result of removing the conductive layer in a periphery region.

Referring to FIG. 2D, a region of the structure shown in FIG. 2C used to form MIM capacitors is covered by a photoresist layer 210 and the uncovered portion of the conductive layer 208 is removed by conventional methods such as etching. The etching method used to remove the exposed conductive layer 208 preferably comprises, but is not limited to: a reactive ion etching process. The exposed region of the structure shown in FIG. 2C is used to form periphery metal lines of a multilevel interconnect structure.

Figure 2E:
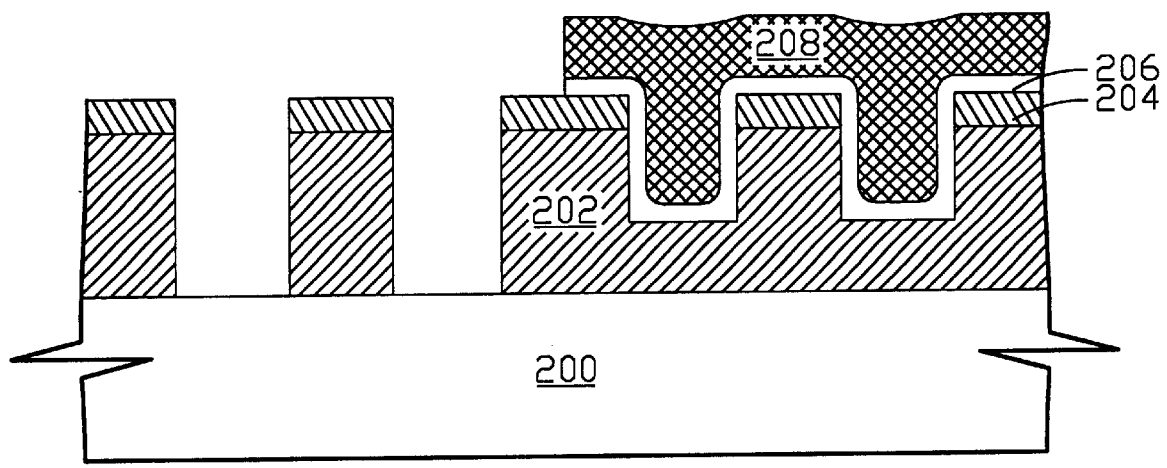
FIG. 2E shows a result of removing the exposed dielectric layer shown in FIG. 2D and sequentially etching through the conductive layer to expose the substrate.

Referring to FIG. 2E, the exposed portion of the dielectric layer 206 is removed and then the underlying conductive layer 202 is further etched through to expose the substrate 200. To form the structure shown in FIG. 2E, the exposed portion of the dielectric layer 206 is first removed by conventional etching methods such as anisotropic dry etching. This dry etching method is preferably a reactive ion etching process. The photoresist layer 210 together with the photoresist pattern used to cover the conductive layer 204 are finally removed. The remaining conductive layers 202 and 204 in this periphery region are used to form metal lines of the multilevel interconnect structure. The conductive layer 202 and 208 are the two electrodes of the MIM capacitor of this invention and the dielectric layer 206 is the insulating layer of the MIM capacitor. It is noted that although there are only two trenches in this MIM capacitor shown in FIG. 2E, this MIM capacitor can still has more than two trenches filled with the conductive layers 202, 208 and the dielectric layer 206. The more the filled trenches, the larger the capacitance this MIM capacitor has.

The invention integrates the formations of the periphery metal lines and the three-dimensional MIM capacitor thereby not only reduces the process step needed, but also increases the capacitance of the MIM capacitor without occupying more area. The integration of this integrated circuit can be upgraded. Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method of forming a metal-insulator-metal capacitor, said method comprising:

providing a substrate having a first region and a second region;

forming a first conductive layer over said substrate;

forming a second conductive layer over said first conductive layer;

transferring a plurality of trench patterns into said second conductive layer and said first conductive layer to form a plurality of trenches in said first region and said second region;

conformally forming a dielectric layer over said second conductive layer and said first conductive layer;

forming a third conductive layer over said dielectric layer;

forming a photoresist layer to cover said first region;

removing said third conductive layer on said second region to expose said dielectric layer on said second region;

removing said dielectric layer on said second region to expose said second conductive layer and said first conductive layer on said second region;

etching through the bottoms of said trenches in said second region to expose said substrate; and removing said photoresist layer.

2. The method according to claim 1, wherein said first conductive layer comprises an aluminum layer.

3. The method according to claim 1, wherein said first conductive layer comprises a copper layer.

4. The method according to claim 1, wherein said second conductive layer comprises a titanium/titanium nitride layer.

5. The method according to claim 1, wherein said second conductive layer comprises a tantalum/tantalum nitride layer.

6. The method according to claim 1, wherein said dielectric layer comprises a silicon dioxide layer.

7. The method according to claim 1, wherein said third conductive layer comprises an aluminum layer.

8. The method according to claim 1, wherein said third conductive layer comprises a copper layer.

9. A method of forming a metal-insulator-metal capacitor, said method comprising:

provided a substrate having a first region and a second region;

forming a first conductive layer over said substrate;

forming a second conductive layer over said first conductive layer;

transferring a plurality of trench patterns into said second conductive layer and said first conductive layer to form a plurality of trenches in said first region and said second region;

conformally forming a dielectric layer over said second conductive layer and said first conductive layer by a plasma enhanced chemical vapor deposition process;

forming a third conductive layer over said dielectric layer;

forming a photoresist layer to cover said first region;

removing said third conductive layer on said second region to expose said dielectric layer on said second region by a dry etching process;

removing said dielectric layer on said second region to expose said second conductive layer and said first conductive layer on said second region;

etching through the bottoms of said trenches in said second region to expose said substrate; and removing said photoresist layer.

10. The method according to claim 9, wherein said first conductive layer comprises an aluminum layer.

11. The method according to claim 9, wherein said first conductive layer comprises a copper layer.

12. The method according to claim 9, wherein said second conductive layer comprises a titanium/titanium nitride layer.

13. The method according to claim 9, wherein said second conductive layer comprises a tantalum/tantalum nitride layer.

14. The method according to claim 9, wherein said third conductive layer comprises an aluminum layer.

15. The method according to claim 9, wherein said third conductive layer comprises a copper layer.

16. A method of forming a metal-insulator-metal capacitor, said method comprising:

providing a substrate having a first region and a second region;

forming a first conductive layer over said substrate;

forming a second conductive layer over said first conductive layer;

transferring a plurality of trench patterns into said second conductive layer and said first conductive layer to form a plurality of trenches in said first region and said second region;

conformally forming a dielectric layer over said second conductive layer and said first conductive layer by a plasma enhanced chemical vapor deposition process;

forming a third conductive layer over said dielectric layer;

forming a photoresist layer to cover said first region;

removing said third conductive layer on said second region to expose said dielectric layer on said second region by a dry etching process;

removing said dielectric layer on said second region to expose said second conductive layer and said first conductive layer on said second region;

etching through the bottoms of said trenches in said second region to expose said substrate by a dry etching process; and removing said photoresist layer.

* * * * *